United States Patent
Feng et al.

(10) Patent No.: US 8,263,177 B2
(45) Date of Patent: Sep. 11, 2012

(54) ORGANIC POLYMER COATING FOR PROTECTION AGAINST CREEP CORROSION

(76) Inventors: Kesheng Feng, Cheshire, CT (US); Nilesh Kapadia, Shelton, CT (US); Witold Paw, New Fairfield, CT (US)

( * ) Notice: Subject to any disclaimer, the term of this patent is extended or adjusted under 35 U.S.C. 154(b) by 679 days.

(21) Appl. No.: 12/383,650

(22) Filed: Mar. 27, 2009

(65) Prior Publication Data

US 2010/0243301 A1    Sep. 30, 2010

(51) Int. Cl.
*B05D 5/12* (2006.01)
*H05K 1/00* (2006.01)
*B32B 3/00* (2006.01)

(52) U.S. Cl. ............... 427/96.2; 427/97.1; 427/98.6; 428/901; 428/209; 174/258; 174/259

(58) Field of Classification Search ............ 427/58, 427/96.2, 97.1, 98.6; 174/258, 259; 428/209, 428/901
See application file for complete search history.

(56) References Cited

U.S. PATENT DOCUMENTS

| | | | |
|---|---|---|---|
| 4,183,772 A * | 1/1980 | Davis | 428/472 |
| 5,085,696 A * | 2/1992 | Muller et al. | 106/14.16 |
| 5,173,130 A * | 12/1992 | Kinoshita et al. | 148/268 |
| 5,858,074 A | 1/1999 | Cole et al. | |
| 5,960,251 A | 9/1999 | Brusic et al. | |
| 6,517,893 B2 | 2/2003 | Abys et al. | |
| 6,534,192 B1 | 3/2003 | Abys et al. | |
| 6,635,123 B2 | 10/2003 | Cavallotti et al. | |
| 6,773,757 B1 | 8/2004 | Redline et al. | |
| 6,815,088 B2 | 11/2004 | Cavallotti et al. | |
| 2002/0015782 A1 | 2/2002 | Abys et al. | |
| 2005/0139644 A1 | 6/2005 | Brese et al. | |
| 2006/0113683 A1 | 6/2006 | Dean et al. | |
| 2006/0210819 A1 | 9/2006 | Dueber | |
| 2006/0269760 A1 | 11/2006 | Sugama | |
| 2008/0173470 A1 | 7/2008 | Barbetta et al. | |
| 2008/0268267 A1 | 10/2008 | Barbetta et al. | |

* cited by examiner

*Primary Examiner* — Brian K Talbot
(74) *Attorney, Agent, or Firm* — Carmody & Torrance LLP

(57) ABSTRACT

A process is described for treating metal surfaces printed wiring boards and similar substrates to provide improved creep corrosion resistance on such surfaces. A modified organic solderability preservative composition is used in combination with an emulsion polymer to provide a modified polymer coating on the metal surface finish via a chemical reaction to provide enhanced corrosion protection of the surface.

13 Claims, 5 Drawing Sheets
(5 of 5 Drawing Sheet(s) Filed in Color)

ORGANIC POLYMER COATING FOR PROTECTION AGAINST CREEP CORROSION

FIELD OF THE INVENTION

The present invention relates generally to an improved organic surface finish for printed wiring boards and similar substrates which provides improved creep corrosion resistance on final metal finishes on these substrates.

BACKGROUND OF THE INVENTION

Printed wiring board (PWB) manufacturing processes have developed and changed at a rapid rate due to the increased demand for enhanced performance. The demand for enhanced performance is due, for example, to higher circuit densities, increases in board complexities and an increase in the cost of environmental compliance. Various types of final finishes are used on PWBs, and the selection of a final finish is typically dependent on the requirements that the board must ultimately meet. Surface circuits on PWBs usually include copper and copper alloy materials that generally must be coated to provide good mechanical and electrical connections with other devices in the assembly.

Typically, the coating on the circuits is called the surface finish. The circuits include non-contact areas and contact areas. The finish applied to the non-contact areas is called the non-contact finish and the finish applied to the contact areas is called the contact finish. Non-contact areas include wire-bonding areas, chip attach areas, soldering areas and other non-contact areas. Non-contact and contact finishes must meet certain different requirements. For example, non-contact finishes must provide good solderability, good wirebonding performance and high corrosion resistance. On the other hand, contact finishes must provide high conductively, high wear resistance and high corrosion resistance. To meet these different requirements, different coatings have been developed for non-contact finishes and contact finishes Some typical non-contact finishes include (i) hot air solder level (HASL) coating, (ii) electroless nickel/immersion gold (ENIG), (iii) organic solderability preservatives (OSP), (iv) organo-metallic coatings, such as organo-silver, where the organic is co-deposited with the silver, (v) immersion silver (ImAg) and (vi) immersion tin (ImSn). These final finishes were generally developed to ensure a good solderable surface for component assembly during the board assembly process. A typical contact finish may include an electrolytic nickel coating with an electrolytic hard gold layer (gold-nickel or gold-cobalt alloys containing less than about 0.3 weight percent of nickel or cobalt) on top. To coat any of the above non-contact finishes on the non-contact areas or to coat the finish on the contact areas requires considerable processing steps and a considerable amount of time which potentially decreases production yields and also increases costs.

The PWB industry has begun to evaluate alternative surface finishes. There is a high demand for a multi-purpose finishes that can be used for both non-contact areas and contact areas and that can replace tin-lead in the PWB finishing processes, to lower environmental concerns and to make electronic circuit manufacturing "greener." To be qualified, such a finish should provide high etch resistance, good solderability, good wirebonding performance, high conductivity, high wear resistance, high corrosion resistance/low porosity, coplanarity (uniform thickness distribution), integrity after exposure to soldering temperatures, ability to integrate into current manufacturing processes, have long storage life, and environmental safety.

Some known production methods utilize high-lead solder materials. Although most high-lead solders are relatively inexpensive and exhibit desirable properties, the use of lead in die attach and other solder materials has come under increased scrutiny from an environmental and occupational health perspective. Therefore, various approaches have been undertaken to replace lead-containing solder with lead-free materials.

The lead free final finishes most commonly applied today to printed circuit boards and other similar devices are organic solderability preservatives (OSP), immersion silver (ImAg), electroless nickel/immersion gold (ENIG), and immersion tin (ImSn) which were generally developed to ensure a good solderable surface for component assembly during the board assembly process. Examples of OSP compositions are described for example in U.S. Pat. No. 5,858,074 to Cole et al., U.S. Pat. No. 6,635,123 to Cavallotti et al. and U.S. Pat. No. 6,815,088 to Cavallotti et al., the subject matter of each of which is herein incorporated by reference in its entirety.

Corrosion resistance, particularly in harsh industrial environments, was not a design criterion. The effects of environmental pollutants on inducing failures in electronic products are far more serious in the lead-free world. With the transition to lead-free, two key factors are changed which increased the vulnerability of circuitry to environmental corrosion. First, HASL-alternative coatings, which rely on very thin deposits, are not especially robust as defenses to pollution. Secondly, the increased temperatures at which these coatings are soldered often detract from their ability to protect the circuitry over long periods of post assembly exposure. The printed circuit board industry has identified several cases of failure due to environmental conditions leading to corrosion, including a particular type of corrosion termed "creep corrosion."

Accelerated creep corrosion has been observed on these finishes, particularly in sulfur-bearing environments, such as paper mills where sulfur is used in the bleaching process, tire manufacturing plants, which utilize a rubber vulcanization process, and in automotive prototype design studios, where the modeling clay that is used can contain in excess of 40% elemental sulfur, by way of example and not limitation. Where this occurs, short circuits may occur due to growth of corrosion product leading to system failure.

The inventors of the present invention have determined that the use of a modified OSP-type coating composition in combination with an emulsion polymer exhibits improved creep corrosion resistance for metal finishes on printed wiring boards, such as silver final finishes.

BRIEF DESCRIPTION OF THE DRAWINGS

The patent or application file contains at least one drawing executed in color. Copies of this patent or patent application publication with color drawing(s) will be provided by the Office upon request and payment of the necessary fee.

SUMMARY OF THE INVENTION

Figure 1:
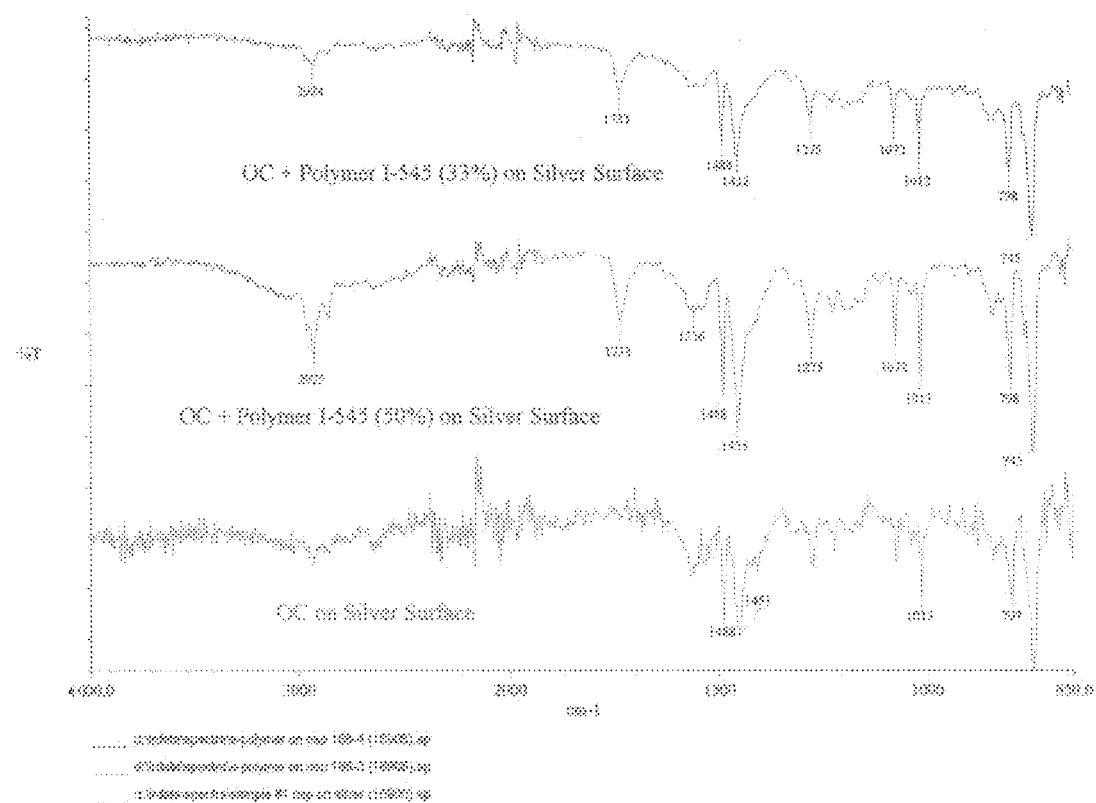
FIG. 1 depicts an FT-IR spectra after the silver final finish was coated with organics and emulsion polymers.

It is an object of the present invention to provide improved creep corrosion resistance for metal finishes on printed wiring board and other similar substrates.

It is another object of the present invention to provide improved creep corrosion resistance on silver final finishes on such printed wiring board substrates.

It is another object of the present invention to provide an efficient way to put polymer coatings on a metal surface finish via a chemical reaction.

It is still another object of the present invention to provide an improved polymer coating composition that can protect metal finishes on printed wiring boards and other similar substrates.

To that end, the present invention relates to a method of improving creep corrosion resistance of metal finishes on printed wiring boards and other similar substrates, the method comprising the steps of:

a) contacting a metal surface on a printed circuit board with an aqueous solution comprising a material selected from the group consisting of azoles, imidazoles, and benzimidazoles; and thereafter b) contacting the metal surface with an aqueous emulsion polymer mixture, wherein the emulsion polymer has at least one acid or amine functional group.

The inventors have found that contacting the metal with the aqueous organic solution comprising a material selected from the group consisting of azoles, imidazoles and benzimidazoles followed by an emulsion polymer with acid or amine functional groups provides a modified polymer coating on the metal surface that provides improved creep corrosion resistance on the surface.

Other objects, features and advantages of the invention will hereinafter become more readily apparent from the following description.

DETAILED DESCRIPTION OF THE INVENTION

The present invention relates to an organic/polymer coating formed on a metal surface, such as silver or copper or alloys thereof, after the printed wiring boards are processed though an aqueous solution that contains a material selected from the group consisting of azoles, imidazoles, and benzimidazoles. The coated surface is then immersed into an aqueous mixture of an emulsion polymer to coat the emulsion polymer on the surface. The emulsion polymer contains functional groups such as acids or amines which react with the functional groups of the material which was previously coated onto the metal surface. This provides improved creep corrosion resistance of the metal surface.

In one embodiment, the present invention relates generally to a method of improving creep corrosion resistance on a metal surface on a printed wiring board, the method comprising the steps of:

a) contacting the metal surface on the printed wiring board with an aqueous organic solution comprising a material selected from the group consisting of azoles, imidazoles, and benzimidazoles; and thereafter b) contacting the metal surface with an aqueous emulsion polymer mixture;

wherein the emulsion polymer comprises at least one acid or amine functional group, and wherein the metal surface comprises copper or silver or an alloy of any of the foregoing.

The aqueous organic solution, optionally but preferably, also comprises a source of cupric ions, which is typically selected from the group consisting of copper acetate, cupric chloride, cupric bromide, cupric hydroxide, cupric salts of organic acids and combinations of one or more of the foregoing. In one embodiment, the source of cupric ions is copper acetate. The source of cupric ions is typically present in the aqueous organic solution at a concentration of between about 0.01 g/l and about 20 g/l.

The aqueous organic solution, optionally but preferably, also comprises a source of halide ions, which is typically selected from the group consisting of calcium chloride, potassium chloride, ammonium chloride, ammonium bromide, potassium bromide, copper chloride, zinc chloride, iron chloride, iron bromide, tin bromide, copper bromide, and combinations of one or more of the foregoing. In one embodiment, the source of halide ions is ammonium bromide. The source of halide ions is typically present in the aqueous organic solution at a concentration of between about 0.01 g/l and about 20 g/l.

The aqueous organic solution must comprise a material selected from the group consisting of azoles such as imidazoles and benzimidazoles. Suitable materials include benzimidazoles substituted in the 2-position with alkyl, aryl or halide groups. Most preferable is 2-(p-bromobenzyl)benzimidazole. The concentration of the material in the aqueous solution can be from 0.01 g/l to 20 g/l but is preferably from 1 g/l to 5 g/l. The pH of the aqueous organic solution is preferably from 1 to 5 and is preferably adjusted using an organic acid.

Once the printed wiring board has been contacted with the aqueous organic solution it is then contacted with an aqueous emulsion polymer mixture.

The aqueous emulsion polymer comprises functional groups selected from the group consisting of acids groups, amine groups and combinations of the foregoing. The functional groups of the emulsion polymer react with the functional groups of the coating produced by the aqueous organic solution to form a modified polymer coating on the metal surface.

The emulsion polymer may preferably comprise an acrylic- or styrene-type polymer. In one embodiment, the emulsion polymer comprises carboxylic acid functional groups. Examples of suitable aqueous emulsion polymer compositions include RHOPLEX™ I-2426 D, a water-based acrylic emulsion polymer, RHOPLEX™ I-545, a water based acrylic emulsion polymer, and RHOPLEX™ 2500, a 100% acrylic emulsion polymer, all available from Rohm and Haas, Philadelphia, Pa.

The metal surface on the printed wiring board is typically selected from the group consisting of copper, silver and combinations of one or more of the foregoing. The metal surface is typically contacted with the aqueous organic composition and the emulsion polymer composition by immersion coating, spray coating or roller coating. Once the printed wiring board has been contacted with the aqueous organic solution and the aqueous emulsion polymer mixture, the treated board is dried.

In one embodiment, printed wiring boards with silver final finish are processed through an aqueous solution comprising:
  a) a derivative of benzimidazole;
  b) acetic acid;
  c) copper acetate; and
  d) ammonium bromide
to form an organic coating on the silver final finish. Thereafter, the boards that have been coated with the organic aqueous solution are processed through an emulsion polymer aqueous solution containing acid functional groups, whereby a polymer coating is formed on the organic coating by chemical reaction.

Example 1

Boards with a silver final finish were processed through an aqueous organic coating solution containing:

| | |
|---|---|
| 106 ml/l | acetic acid |
| 4.1 g/l | 2-methyl benzimidazole |
| 2.5 g/l | copper acetate |
| 1.0 g/l | ammonium bromide | pH is adjusted by ammonia solution and maintained at 2.9

The dwell time of the boards in the organic coating solution was 1 minute at 40° C. The boards were rinsed with deionized water for 30 seconds and then processed through a solution comprising between 33% and 50% by weight of the Rhoplex™ I-545 emulsion polymer for 1-2 minutes at 40° C. The boards were then rinsed with deionized water and air-dried to finish the coating process.
FT-IR was used to check the components in the organic/polymer coating. The spectra indicated the benzimidazole and polymer (1733 cm-1) on the coating surface, as seen in FIG. 1.

The coated boards were then processed through the reflow oven twice and put in a chamber for tarnish testing and a second chamber for creep corrosion tests, respectively.
The conditions of the tarnish chamber were as follows:
  1) Preheat the sulfur chamber to a temperature of 40 to 45° C. (maintain the temperature during the test).
  2) Suspend the reflow panels in the sulfur chamber.
  3) Prepare a 0.45 g of sodium hydrosulfide hydrate in 400 ml deionized water solution.
  4) Use the prepared solution in the sulfur chamber, 200 ml solution in two porcelain disks and add 2 ml hydrochloric acid in each disc.
  5) Close the sulfur chamber air tight and monitor the control panel for tarnish.
  6) Once the control panel gets tarnish, open the chamber and remove all panels.
  7) Evaluate tarnish effect respective to the control panel.

Figure 2:
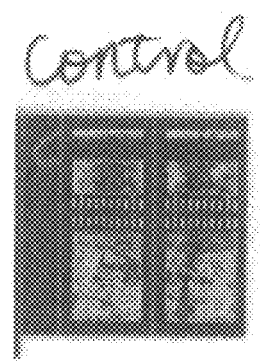
FIG. 2 depicts tarnish results on silver final finish surfaces.
Figure 3:
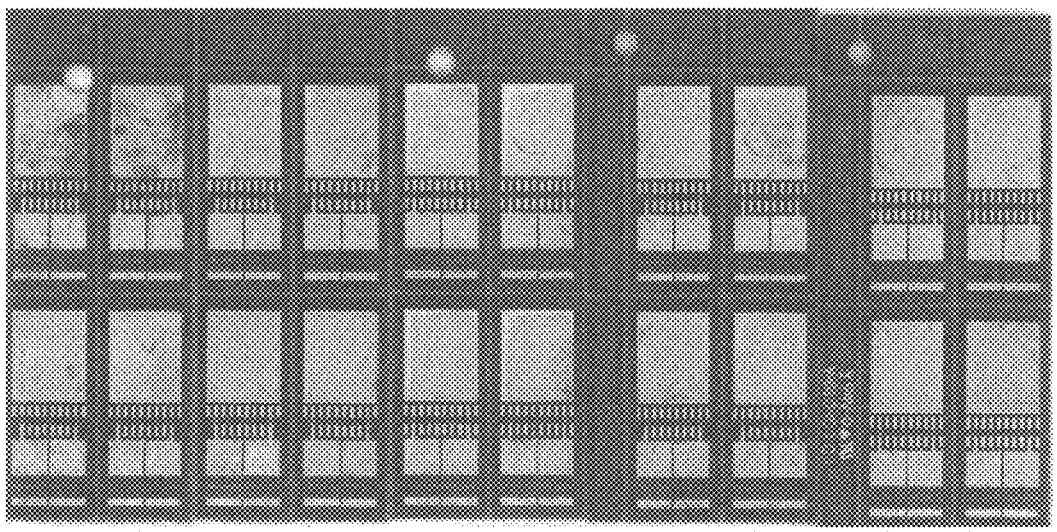
FIG. 3 depicts tarnish results on silver final finish coated with the OSP and emulsion polymer of this invention.

After the panels were taken out of the tarnish chamber, silver surfaces without coating showed severe tarnish as depicted in FIG. 2, while the boards with coatings thereon showed almost no tarnish as depicted in FIG. 3.

The conditions of the creep corrosion testing chamber were as follows:
  1) Preheat the oven to 50° C.
  2) 10 g of sulfur powder were combined with 2 grams of 2-mercaptobenzothiazole. The powder mixture was placed at the bottom of a 0.14 ft³ container with 50 ml of water.
  3) Samples were hung above the powder mixture and the chamber was covered and sealed.
  4) The entire container was then placed in an oven at 50° C. for the test.
  5) Every 24 hours, the chamber was removed from the oven and cooled to room temperature to ensure condensation.
  6) Total time in the oven was 72 hours.

After the boards were taken out of the creep corrosion test chamber, the creep corrosion was checked under a microscope for SM pattern and metal pattern areas. The degree of creep corrosion was numbered as follows:
  0=no creep corrosion
  1=very slight creep corrosion
  2=slight creep corrosion
  3=moderate creep corrosion
  4=severe creep corrosion SM represents a pattern that metal area was connected to solder mask.

Metal represents a pattern that metal area was not connected to solder mask.

TABLE 1

Creep Corrosion results

| | | Solderability | | | Creep Corrosion | |
|---|---|---|---|---|---|---|
| Panel | Bath | Paste | Wave | Hole Fill | SM | Metal |
| 1 | OC + 33% of I-545 | Uniform/wet | Uniform/wet | pass | 2 | 1 |
| 2 | OC + 50% of I-545 | Uniform/wet | Uniform/wet | pass | 2 | 1 |
| 3 | OC itself | Slightly dewet | Slightly dewet | pass | 3.5 | 2 |
| Ag | Control | Uniform/wet | Uniform/wet | pass | 4 | 3 |

Figure 4:
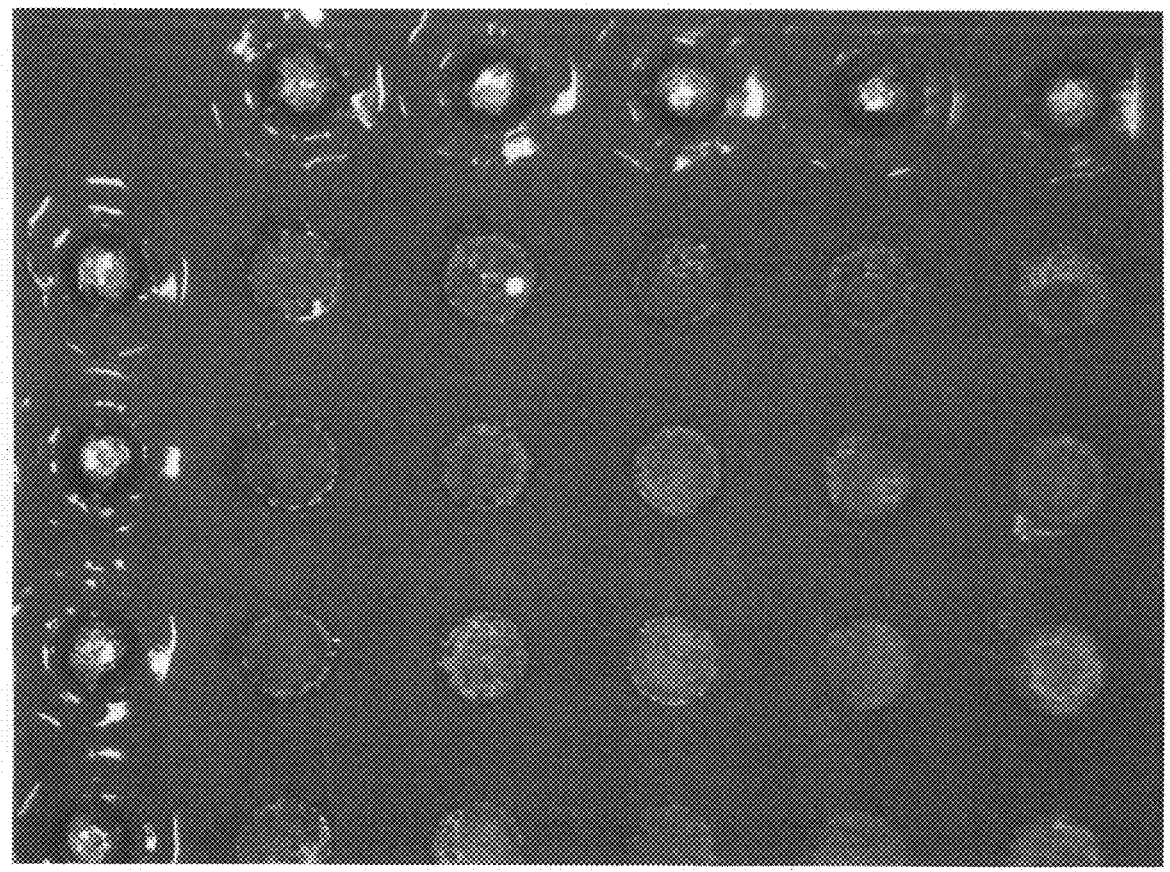
FIG. 4 depicts silver surface after they have been processed in a creep corrosion chamber.
Figure 5:
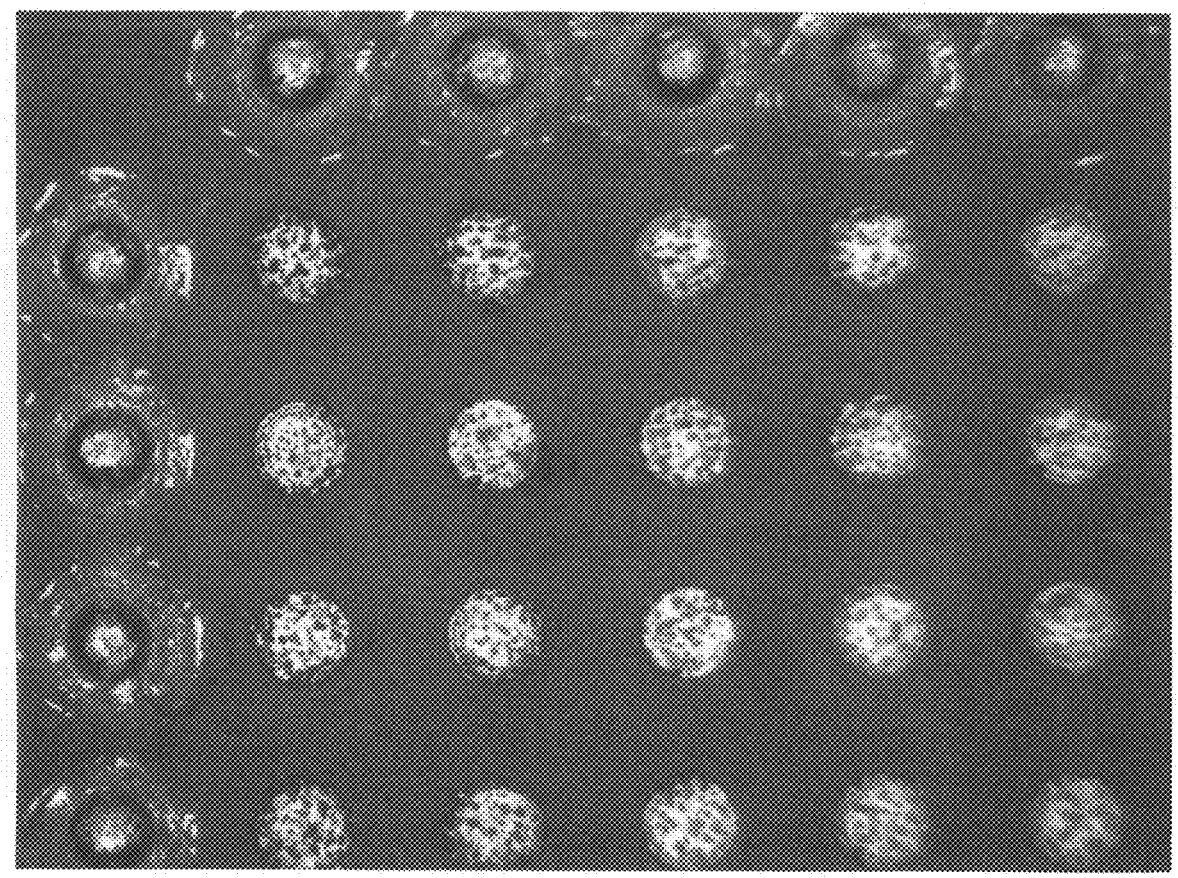
FIG. 5 depicts silver surface coated with organic coatings and an emulsion polymer composition (RHOPLEX™ I-545) after they have been processed in a creep corrosion chamber.

FIGS. 4 and 5 and the values depicted in Table 1 demonstrated that the organic/polymer-coated silver final finish had great resistance to tarnish and creep corrosion comparing to silver final finish itself.

A solderability test was normally performed when the samples for creep corrosion tests were prepared as shown in Table 1 and paste, wave and hole fill were all checked. To further confirm the solderability of the organic/polymer coatings, four panels for each condition (before and after reflow) were tested; silver itself was used as the control. It was determined that the solderability was equivalent to the control silver final finish.

The process described herein uses chemical reactions to form organic/polymer coatings specifically on metal surface areas to prevent the metal from tarnish and creep corrosion. The coated surface showed good solderability, before and after reflow. Due to the nature of the process described herein, the organic/polymer coatings can be applied using horizontal equipment.

It can thus be seen that the present invention is advantageous in that it provides an improved method of providing improved creep corrosion resistance on metal finishes of printed wiring boards and other similar substrates.

It will thus be seen that the objects set forth above, among those made apparent from the preceding description, are efficiently attained and, since certain changes may be made in the above constructions without departing from the spirit and scope of the invention, it is intended that all matter contained in the above description or shown in the accompanying drawings shall be interpreted as illustrative and not in a limiting sense.

What is claimed is:

1. A method of improving creep corrosion resistance of a metal surface on a printed wiring board, the method comprising the steps of:
    a) contacting the metal surface on the printed wiring board with an aqueous organic solution comprising a material selected from the group consisting of azoles, imidazoles, and benzimidazoles; and thereafter
    b) contacting the metal surface, which has been contacted with the aqueous organic solution in step (a), with an aqueous emulsion polymer mixture comprising an emulsion polymer;

wherein the emulsion polymer comprises at least one acid or amine functional group and wherein the metal surface comprises copper, silver or alloys of copper or silver.

2. The method according to claim 1, wherein the aqueous organic solution also comprises a source of copper ions.

3. The method according to claim 1, wherein the aqueous organic solution also comprises a source of halide ions.

4. The method according to claim 1, wherein the material is a benzimidazole substituted in the 2-position.

5. The method according to claim 3, wherein the source of halide ions is selected from the group consisting of calcium chloride, potassium chloride, ammonium chloride, ammonium bromide, potassium bromide, copper chloride, zinc chloride, iron chloride, iron bromide, tin bromide, copper bromide, and combinations of one or more of the foregoing.

6. The method according to claim 1, wherein the aqueous organic solution also comprises an organic acid and the pH of the solution is from 1 to 5.

7. The method according to claim 1, wherein the material is present in the aqueous organic solution at a concentration between about 0.01 g/l and about 20 g/l.

8. The method according to claim 1, wherein the printed wiring board that has been contacted with the aqueous organic solution and the aqueous emulsion polymer composition is air-dried.

9. The method according to claim 1, wherein the functional groups of the emulsion polymer react with functional groups on a coating produced on the metal surface by the aqueous organic solution such that a modified polymer coating is formed on the metal surface.

10. The method according to claim 1, wherein the emulsion polymer is an acrylic- or styrene-type polymer.

11. The method according to claim 10, wherein the emulsion polymer comprises carboxylic acid functional groups.

12. The method according to claim 1, wherein the metal surface is contacted with the aqueous organic solution and the emulsion polymer composition by immersion coating, spray coating or roller coating.

13. A printed wiring board comprising:
    (i) a metal surface comprising copper or silver;
    (ii) a coating comprising a material selected from the group consisting of azoles, imidazoles, benzimidazoles, which coating is on the metal surface;
    (iii) a layer of an emulsion polymer which emulsion polymer comprises at least one acid or amine functional group and which layer is located upon the coating;

wherein the emulsion polymer is chemically reacted with the coating.

* * * * *